United States Patent
Sangster et al.

(10) Patent No.: US 8,286,056 B2
(45) Date of Patent: *Oct. 9, 2012

(54) ENCODING AND APPLICATION OF EXTENDED HAMMING CHECKSUM

(75) Inventors: Daniel M. Sangster, Bellevue, WA (US); Robert A. Kleewein, Redmond, WA (US); Nino Aldrin L. Sarmiento, Monroe, WA (US)

(73) Assignee: Microsoft Corporation, Redmond, WA (US)

( * ) Notice: Subject to any disclaimer, the term of this patent is extended or adjusted under 35 U.S.C. 154(b) by 863 days.

This patent is subject to a terminal disclaimer.

(21) Appl. No.: 12/356,095

(22) Filed: Jan. 20, 2009

(65) Prior Publication Data
US 2009/0132892 A1 May 21, 2009

Related U.S. Application Data

(62) Division of application No. 11/217,521, filed on Aug. 31, 2005, now Pat. No. 7,500,174.

(60) Provisional application No. 60/683,618, filed on May 23, 2005.

(51) Int. Cl.
*H03M 13/00* (2006.01)
(52) U.S. Cl. ........................ 714/776; 714/758
(58) Field of Classification Search .................. 714/776, 714/758
See application file for complete search history.

(56) References Cited

U.S. PATENT DOCUMENTS

| | | | |
|---|---|---|---|
| 5,774,480 A | 6/1998 | Willy | |
| 6,404,820 B1* | 6/2002 | Postol | 375/259 |
| 6,763,492 B1 | 7/2004 | Hurt et al. | |
| 7,085,983 B2 | 8/2006 | Ohta | |
| 7,124,351 B2 | 10/2006 | Aldridge et al. | |
| 2003/0144836 A1* | 7/2003 | Kurtz | 704/230 |
| 2003/0192002 A1* | 10/2003 | Sweeney et al. | 714/755 |
| 2004/0066271 A1* | 4/2004 | Leck | 340/3.1 |
| 2006/0044162 A1* | 3/2006 | Fenn et al. | 341/50 |

OTHER PUBLICATIONS

Oh et al., An Efficient Algorithm-Based Fault Tolerance Design Using Extended Rearranged Hamming Checksum, 1992, IEEE, pp. 237-246.*

* cited by examiner

*Primary Examiner* — M. Mujtaba K Chaudry
(74) *Attorney, Agent, or Firm* — L. Alan Collins; Collins & Collins Intellectual, LLC

(57) ABSTRACT

A method for calculating an extended hamming checksum and applying the extended hamming checksum to a data packet, the method comprising forming a packet extended hamming checksum mask, calculating a hamming code, calculating an extended hamming checksum using the packet extended hamming checksum mask and the hamming code, and inserting the extended hamming checksum into the data packet.

20 Claims, 7 Drawing Sheets

ENCODING AND APPLICATION OF EXTENDED HAMMING CHECKSUM

CROSS-REFERENCE TO RELATED APPLICATION(S)

This application is a divisional of and claims priority from U.S. Pat. No. 7,500,174 that was filed on Aug. 31, 2005 and that claims priority from U.S. Provisional Patent Application No. 60/683,618 that was filed on May 23, 2005.

DESCRIPTION OF THE DRAWINGS

The present description will be better understood from the following detailed description read in light of the accompanying drawings, wherein.

Like reference numerals are used to designate like parts in the accompanying drawings.

BACKGROUND

This application relates generally to the use of data packets in communications and more specifically to the encoding and application checksums.

An input device for a computing system, such as a keyboard or mouse, typically communicates with the system using data packets via some communications medium. Checksums may be calculated and applied to the data packets to facilitate the detection and/or correction of errors that may be introduced during communication.

DETAILED DESCRIPTION

The detailed description provided below in connection with the appended drawings is intended as a description of the present examples of encoding and applying an extended hamming checksum ("EHC") and is not intended to represent the only forms in which the present example may be constructed or utilized. The description sets forth the functions of the example and the sequence of steps for encoding/calculating and applying the example. However, the same or equivalent functions and sequences may be accomplished by different examples.

Although the present examples are described and illustrated herein as being implemented in a computing system, the system described is provided as an example and not a limitation. As those skilled in the art will appreciate, the present examples are suitable for application in a variety of different types of computing and electronic systems.

Figure 1:
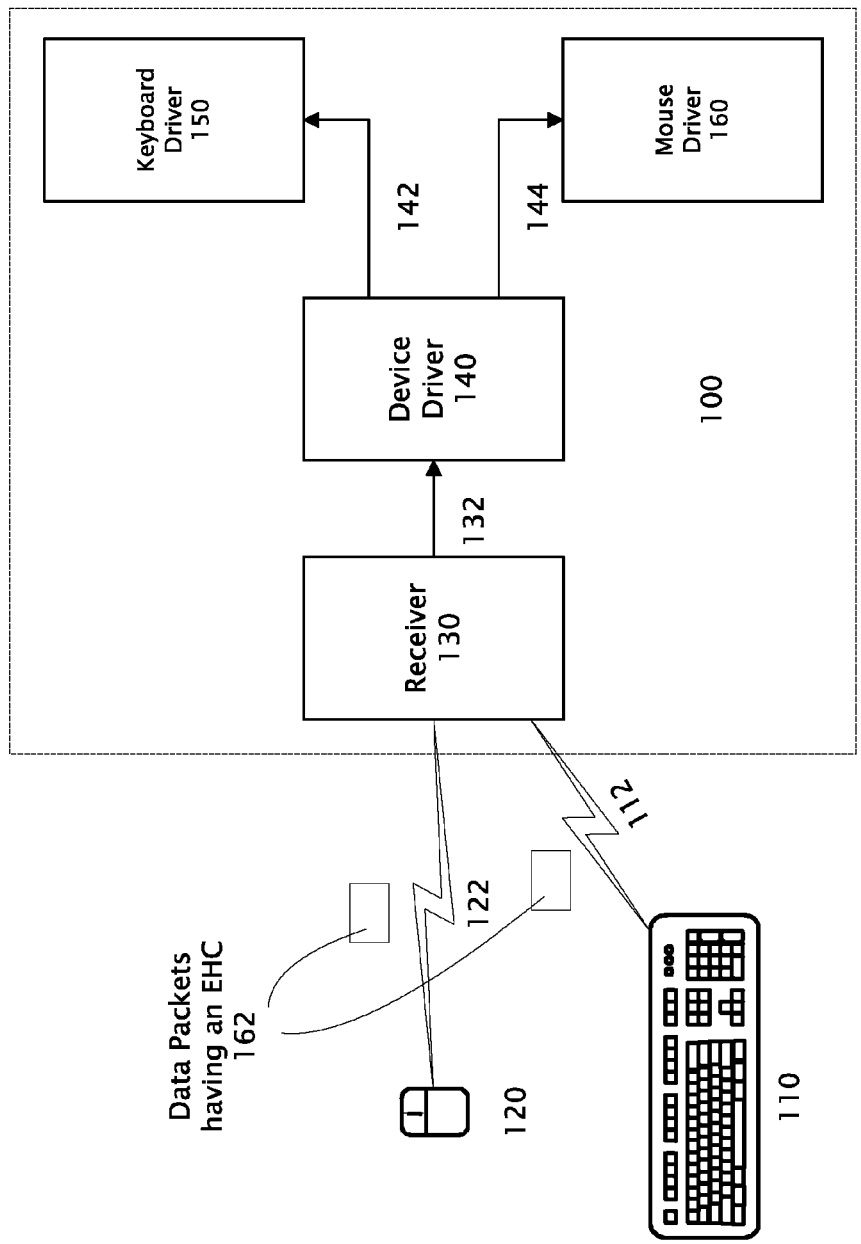
FIG. 1 is a block diagram showing a system including data packets having an EHC being transferred from a keyboard and mouse coupled to a receiver and device drivers of a computing system.

FIG. 1 is a block diagram showing a system including data packets having an EHC being transferred from a keyboard and mouse coupled to a receiver and device drivers of a computing system 100. System 100 couples to input devices, including the keyboard 110 and the pointing device 120, such as a mouse, via the receiver 130 to device drivers 140, 150, 160. Data packets 162 including EHCs flow between the input devices 110 and 120 and the receiver 130. The system 100 may be implemented on a conventional PC, a set-top box, a smart remote control, or the like. These device drivers may provide data from the keyboard and/or pointing device to further elements of the system not shown. Multiple keyboards and/or mice may be supported and each may have different characteristics. Alternatively, other devices may be supported by the system, including remote controls a typically used with televisions, stereos, etc. Keyboards, mice and/or other devices are all examples of typical input devices that may be supported by the system 100.

Keyboard 110 may be coupled 112 to receiver 130 via some communications medium 112 over which the data packets 162 including EHCs are communicated. One example of a communications medium may be infrared light ("IR"). Data identifying key presses may be communicated from the keyboard 110 to the receiver 130 via the coupling 112. Keyboard 110 may have a configuration similar to that of a typical computer keyboard. Alternatively, it may have some other configuration, such as that of a typical remote control.

Pointing device 120 may be coupled 122 to receiver 130 via some communications medium 122. One example of a communications medium may be IR. Data identifying pointing information may be communicated from the pointing device 120 to the receiver 130 via the coupling 122. Pointing device 120 may be a typical computer mouse. Alternatively, it may be a track ball or some other pointing device as typically used with a common computer.

Receiver 130 receives data sent from the input devices via their respective couplings. Receiver 130 may also send information to one or more of the input devices which may be capable of receiving and utilizing sent information. Receiver 130 is typically distinct from the input devices and may be separated from them by a physical distance appropriate to the specific communications medium being employed by each device. Receiver 130 may be coupled to any number of keyboards, pointing devices or other input devices. Different communications mediums may be employed for the various couplings between the various input devices and the receiver 130. Receiver 130 may forward data received from the input devices to device driver 140 via coupling 132 which is typically a wired connection such as a universal serial bus ("USB") connection. Forwarded data may or may not be processed by receiver 130 prior to forwarding.

Device driver 140 may be implemented as a software driver typical of those that operate on conventional computers. Device driver 140 may receive data from the receiver 130 and process that data in preparation for further use by the system 100. This processing may including distinguishing data based on the device it originated from, decoding the data, reformatting the data, validating the data, encrypting and/or decrypting the data, removing noise from the data that may have been introduced during communication or from the communication medium or other sources, etc. Device driver 140 may be implemented as multiple device drivers coupled together, each performing a portion of the processing. Device driver 140 may be coupled to a keyboard device driver 150, a pointing device driver 160, and/or to other device drivers not shown. Alternatively, device driver 140 may provide data from the input devices directly to further elements of the system 100 not shown.

Keyboard driver 150 may be a keyboard device driver typical of those that operate on conventional computers. Keyboard driver 150 may receive data 142 from one or more keyboards, including any coupled to receiver 130, and provide keyboard data to the rest of the system 100, not shown. Keyboard data from device driver 140 may be formatted such that it is indistinguishable in form from other keyboards that may be coupled to the system 100 through more conventional means. That is, keyboard driver 150 may not be aware that data from keyboard 110 was received into the system over a communications media such as IR or the like.

Mouse driver 160 may be a pointing device driver typical of those that operate on conventional computers. Mouse driver 160 may receive data 144 from one or more pointing devices, including any coupled to receiver 130, and provide pointing device data to the rest of the system 100, not shown. Pointing device data from device driver 140 may be formatted such that it is indistinguishable in form from other pointing devices that may be coupled to the system 100 through more conventional means. That is, mouse driver 160 may not be aware that data from pointing device 120 was received into the system over a communications media such as IR or the like.

Figure 2:
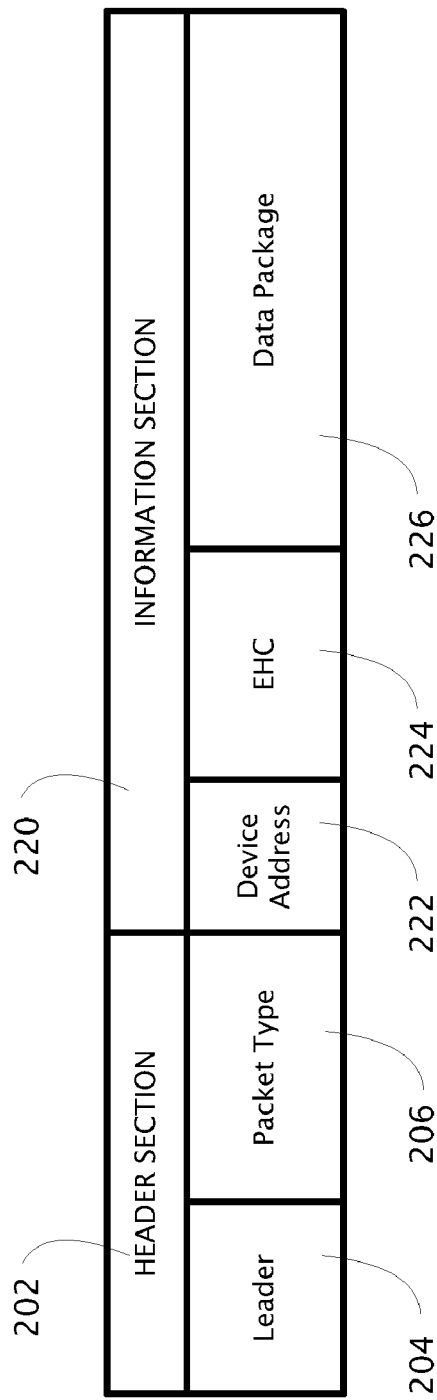
FIG. 2 is a block diagram showing a typical structure for a data packet having an EHC that may be sent from an input device, such as a keyboard or mouse, over a communications medium, such as IR, to a receiver.

FIG. 2 is a block diagram showing a typical structure for a data packet having an EHC that may be sent from an input device, such as a keyboard or mouse, over a communications medium, such as IR, to a receiver. The input device sending the data may also be referred to as the source device. The general data packet structure 162 typically consists of two main parts, a header section 202 and an information section 220.

The header section 202 typically consists of a leader field 204 and a packet type field 206. The leader field 204 is typically used to stabilize the automatic gain control ("AGC") of a receiver such as an IR receiver or the like.

The packet type field 206 may contain a code which specifies the type of device sourcing the data being transmitted in the information field 220. In one example the packet type is typically a 5-bit field which may identify the source device type via one of the codes shown in Table 1.

TABLE 1

| Packet Type Code | Device |
| --- | --- |
| 00100 | Keyboard (standard) |
| 00010 | Keyboard (Japanese) |
| 00001 | Pointing Device |
| 00111 | Remote Control |

The information section 220 typically consists of a device address field 222, an EHC field 224 and space for a data package 226. The device address field 222 may specify the assigned address or ID of the device originating the packet. The data provided in this field 222 may allow the receiver to selectively accept or identify incoming data packets for processing. In one example the device address field is typically 3-bits in length and valid values are typically 0, 1, 2, 3, 4, 5, 6, and 7. The default value is typically 0.

The EHC field 224 may provide data for a means of error detection and/or correction. In one example the EHC field 224 is typically 5-bits in length and tends to be computed by exclusive or-ing ("XORing") a hamming code for the bits in the data packet, typically including the device address.

The data package field 226 typically consists of the data provided by the source device and may include additional EHCs, inverted EHCs or other information. The length of the data package itself typically depends on the source device. In one example the data package field 226 typically contains between 8 and 24 bits of information with various specific data depending on the packet type, as shown in Table 2 through Table 5.

TABLE 2

| Packet Type = 00100 (Keyboard Standard) | | |
| --- | --- | --- |
| Data 0 | Data 1 | Data 2 |
| Key 2 | Key 1 | Modifier |

TABLE 3

| Packet Type = 00010 (Keyboard Japanese) | | |
| --- | --- | --- |
| Data 0 | Data 1 | Data 2 |
| Key 2 | Key 1 | Modifier |

TABLE 4

| Packet Type = 00001 (Pointing Device) | | | |
| --- | --- | --- | --- |
| Data 0 | Data 1 | Data 2 | |
| Y (7 bits) | X (7 bits) | Button (2 bits) | Inverted EHC (5 bits) |

TABLE 5

| Packet Type = 00111 (Remote Control) |
| --- |
| Data 0 |
| Command |

Figure 3:
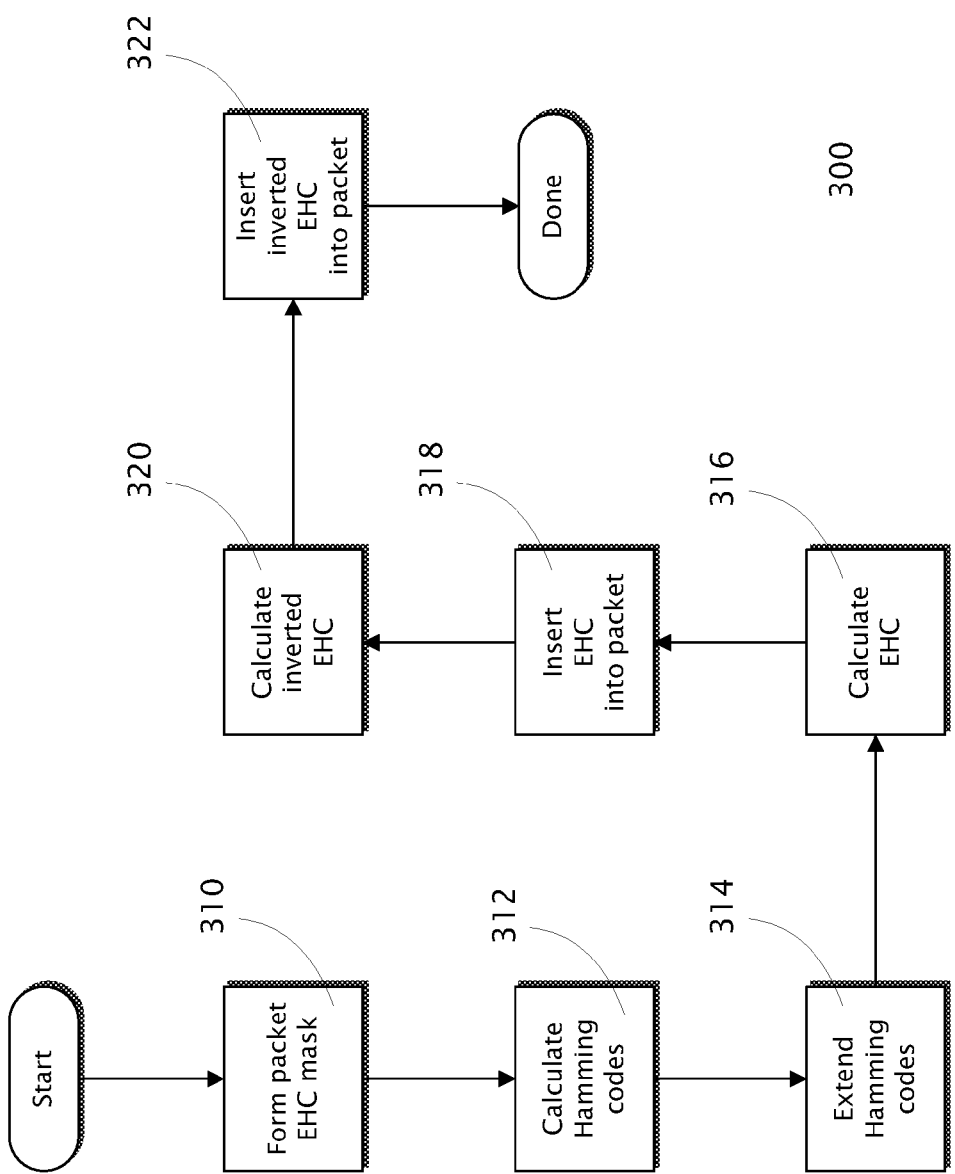
FIG. 3 is a block diagram showing a process for encoding or calculating and applying an EHC to a data package.

FIG. 3 is a block diagram showing a process 300 for encoding or calculating and applying an EHC to a data package. This process may be applied to packets formed from data from various input device types, including those described above. Device data packets being communicated over media such as IR may particularly benefit from applying such EHCs. An EHC may be formed using hamming codes, extended hamming codes and/or by combining an EHC with an inverted EHC in a data packet, as described below. The process steps described below may be performed in alternative orders.

Block 310 shows the forming of a packet EHC mask used to calculate an EHC for a corresponding data packet. The mask typically indicates which bits of the data packet are to be used in the calculation of the EHC and which bits are to be ignored in the calculation. A different mask may be formed and used for each device type or data packet type.

A hamming code is typically assigned to each bit of the data packet that is to be included in the EHC calculation. A value of 0 is typically assigned to those bits that are to be ignored in the calculation. Assignments are generally made by placing a hamming code in the position of the mask corresponding to the desired bit of the data packet. For bits of the packet that are to be ignored in the EHC calculation a zero value is typically placed in the corresponding position of the mask.

In one example, the packet structure and corresponding packet EHC mask for a keyboard device may be of the form shown in Table 6.

TABLE 6

Keyboard packet structure:
    AAACCCCCLLLLLLLLKKKKKKKKMMMMMMMM
Where:
    AAA = device address (A2:A0)
    CCCCC = EHC (C4:C0)
    LLLLLLLL = key 2 value (L7:L0)
    KKKKKKKK = key 1 value (K7:K0)
    MMMMMMMM = modifier (M7:M0)
Keyboard packet EHC mask:
    ULONG EHC_MASK[ ] =
    {
        0x03, // 00011    // m0
        0x05, // 00101    // m1
        0x06, // 00110    // m2
        0x07, // 00111    // m3
        0x09, // 01001    // m4
        0x0A, // 01010    // m5
        0x0B, // 01011    // m6
        0x0C, // 01100    // m7
        0x0D, // 01101    // ka0
        0x0E, // 01110    // ka1
        0x0F, // 01111    // ka2
        0x11, // 10001    // ka3
        0x12, // 10010    // ka4
        0x13, // 10011    // ka5
        0x14, // 10100    // ka6
        0x15, // 10101    // ka7
        0x16, // 10110    // kb0
        0x17, // 10111    // kb1
        0x18, // 11000    // kb2
        0x19, // 11001    // kb3
        0x1A, // 11010    // kb4
        0x1B, // 11011    // kb5
        0x1C, // 11100    // kb6
        0x1D, // 11101    // kb7
        0x0,                // c0 - ignore
        0x0,                // c1 - ignore
        0x0,                // c2 - ignore
        0x0,                // c3 - ignore
        0x0,                // c4 - ignore
        0x1E,// 11110 // a0
        0x1F,// 11111 // a1
        0x1F,// 11111 // a2
    };

In one example, the packet structure and corresponding packet EHC mask for a pointing device may be of the form shown in Table 7.

TABLE 7

Pointing device packet structure:
    AAACCCCCYYYYYYYXXXXXXXBBBCCCCC
Where:
    AAA = device address (A2:A0)
    CCCCC = EHC(C4:C0)
    YYYYYYY = mouse Y value (L6:Y0)
    XXXXXXX = mouse X value (X6:X0)
    BBB = mouse left/right buttons (B1:B0)
    CCCCC = inverted CCCCC (C4:C0)
Pointing device packet EHC mask:
    ULONG EHC_MASK[ ] =
    {
        0x00,             // c0 - ignore
        0x00,             // c1 - ignore
        0x00,             // c2 - ignore
        0x00,             // c3 - ignore
        0x00,             // c4 - ignore
        0x03, // 00011    // b0

TABLE 7-continued

0x05, // 00101    // b1
        0x06, // 00110    // x0
        0x07, // 00111    // x1
        0x09, // 01001    // x2
        0x0A, // 01010    // x3
        0x0B, // 01011    // x4
        0x0C, // 01100    // x5
        0x0D, // 01101    // x6
        0x0E, // 01110    // y0
        0x0F, // 01111    // y1
        0x11, // 10001    // y2
        0x12, // 10010    // y3
        0x13, // 10011    // y4
        0x14, // 10100    // y5
        0x15, // 10101    // y6
        0x0,                // c0 - ignore
        0x0,                // c1 - ignore
        0x0,                // c2 - ignore
        0x0,                // c3 - ignore
        0x0,                // c4 - ignore
        0x16, // 10110    // a0
        0x17, // 10111    // a1
        0x18, // 11000    // a2
    };

In one example, the packet structure and corresponding packet EHC mask for a remote control device may be of the form as shown in Table 8.

TABLE 8

Remote control packet structure:
    AAACCCCCRRRRRRRR
Where:
    AAA = device address (A2:A0)
    CCCCC = EHC(C4:C0)
    RRRRRRRR = command code (R7:R0)
Remote control packet EHC mask:
    ULONG EHC_MASK[ ] =
    {
        0x03, // 00011    // r0
        0x05, // 00101    // r1
        0x06, // 00110    // r2
        0x07, // 00111    // r3
        0x09, // 01001    // r4
        0x0A, // 01010    // r5
        0x0B, // 01011    // r6
        0x0C, // 01100    // r7
        0x0,                // c0 - ignore
        0x0,                // c1 - ignore
        0x0,                // c2 - ignore
        0x0,                // c3 - ignore
        0x0,                // c4 - ignore
        0x0D, // 01101    // a0
        0x0E, // 01110    // a1
        0x0F // 01111    // a2
    };

In the example above the hamming codes tend to be assigned to mask positions in increasing order from the least significant bit in the data packet to the most significant bit, skipping bits that are to be ignored in the EHC calculation. In other examples, the codes may be assigned in decreasing order or in a random order.

Block 312 of FIG. 3 shows the calculation of the hamming codes used in packet EHC masks. In general, the number of bits used to calculate the hamming codes corresponds to the number of bits used in the EHC. In one example the hamming codes tend to be generated by calculating all of the 5-bit numbers from 1 to 31 and dropping the numbers that are powers of 2 (1, 2, 4, 8, and 16). When using 5 bits this results in 26 distinct hamming codes. In other examples different bit counts may be used to generate alternate quantities of distinct hamming codes. The number of bits used tends to correspond to the size in bits of the EHC to be calculated and applied.

Block 314 of FIG. 3 shows the step of extending the hamming codes as needed to account for a number of bits in a data packet greater than the number of distinct hamming codes. This step may not be necessary if the number of packet bits to be included in the EHC calculation is less than the number of distinct hamming codes. When using 5-bit numbers for hamming codes, for example, there are only 26 distinct hamming codes available. For data packets with 26 or less bits of data to be used in an EHC calculation, no extension is needed. But for data packets with more than 26 bits of data the 5-bit hamming codes need to be extended.

One method of hamming code extension is to repeat one of the codes for data bits beyond the $26^{th}$ bit. In one example the "0x1F" hamming code may be reused for bits beyond the $26^{th}$ bit. In the keyboard mask described above, for example, the "a1" bit is the $26^{th}$ bit to have a hamming code assigned and is assigned the maximum 5-bit hamming code value of "0x1F". The "a2" bit, or $27^{th}$ bit, is also assigned the "0x1F" hamming code. In this manner the hamming codes are extended to more data bits than the 26 distinct hamming codes possible when using 5-bit numbers. In other examples, any of the hamming codes could be chosen as a repeat hamming code.

Another method of extending the hamming codes is to repeat the original sequence of hamming codes for the data bits beyond the $26^{th}$ bit. For example, in a packet with 52 data bits the first 26 bits could have the hamming codes assigned in increasing order and the following 26 could have the same hamming codes assigned again in increasing order. In other examples, hamming code extension could include repeating the original sequence of codes in reverse, randomly selecting codes and assigning them to bits in the data packet, etc.

In selecting a scheme for applying and extending hamming codes for EHC calculation, it should be noted that whichever scheme is used in generating the EHC originally is the same scheme that should be used later when validating the EHC.

Block 316 of FIG. 3 shows the step of calculating or encoding an EHC for a data packet using a data packet EHC mask formed as described above. Typically this is done by XORing into an EHC variable the hamming code from the mask for each corresponding bit of the data packet if it is set. In one example the EHC may be calculated as described by the code shown in Table 9 using masks and packet structures as shown in Tables 6, 7 and 8 or the like. It should be recognized that many different code sequences and/or programming languages may be used to perform essentially the same calculations and operations as those provided by the code shown here.

TABLE 9

```
DWORD CalculateEHC(DWORD packet)
{
  DWORD EHC = 0;
  for(int i=0; i<sizeof(EHC_MASK)/sizeof(EHC_MASK[0]);
  i++)
    {
      if(packet & (1<<i))
        {
          EHC ^= HAMMING_MASKS[i];
        }
    }
  return EHC;
}
```

Block 318 of FIG. 3 shows the step of inserting a calculated or encoded EHC into a data packet. In one example, insertion is typically done by taking the 5 relevant bits of the calculated EHC and inserting those bits into the EHC field of the data packet. In other examples the EHC may be less than or greater than 5 bits and may be inserted into the data packet using various arithmetic and/or logical operations.

Block 320 of FIG. 3 shows the calculation or encoding of an inverted EHC. The use of an inverted EHC in conjunction with the original EHC may provide additional error detection and/or correction capability, particularly when used with an input device with a relatively high rate of packet transmission, such as a pointing device. Generally an inverted EHC is calculated by inverting each bit of the original EHC. In other examples the inverted EHC could be replaced with a copy of the original EHC or an otherwise modified or transformed version of the original EHC. Whichever variation of the original EHC is used as an inverted EHC, that same variation should be used when later validating the inverted EHC.

Block 322 of FIG. 3 shows the insertion of the inverted EHC if one is used. This operation is preformed in a manner similar to that described for block 318 above.

Figure 4:
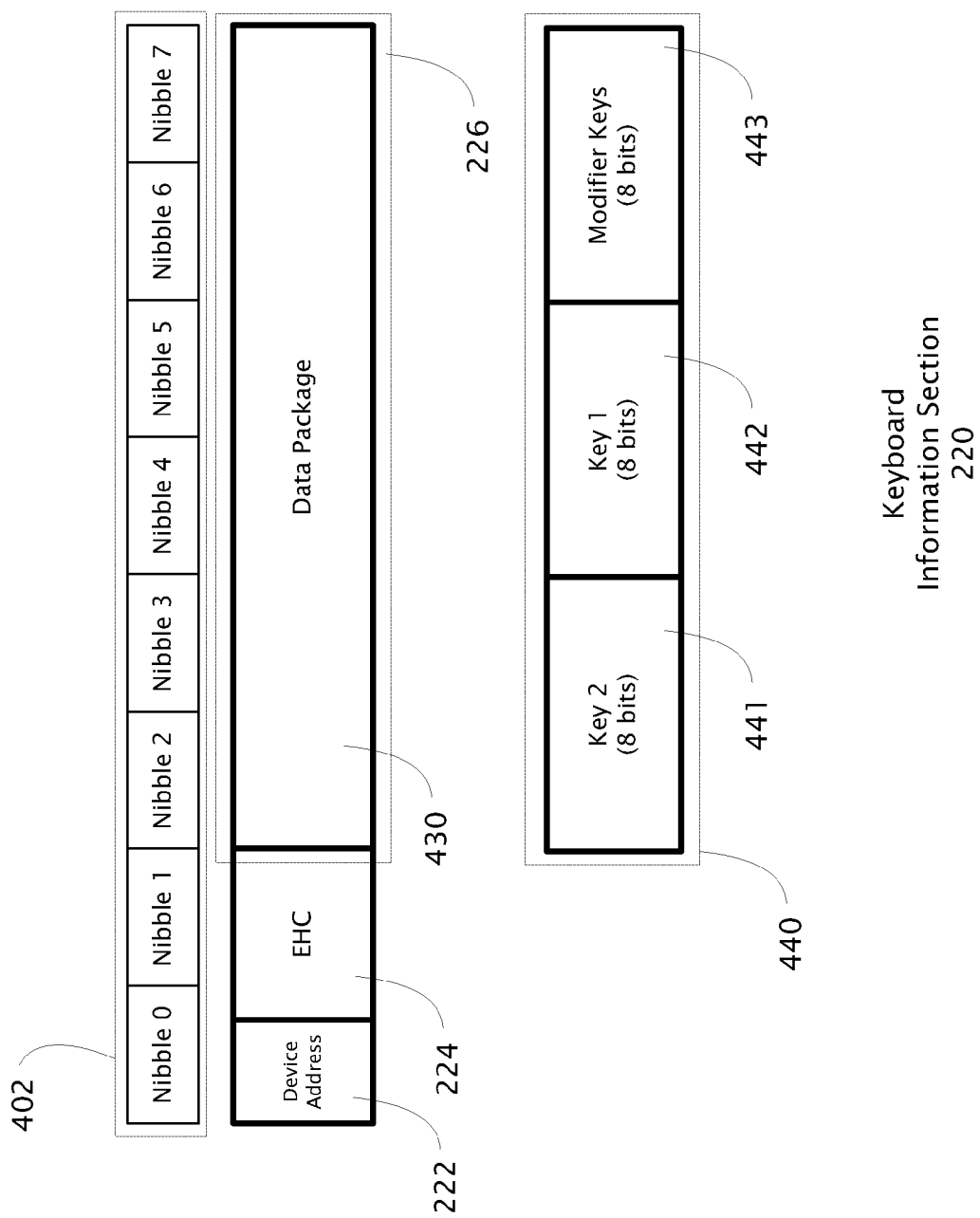
FIG. 4 is a block diagram showing the format of the information section of a typical data packet, having an EHC field, which may be used to communicate keyboard data.

FIG. 4 is a block diagram showing the format of the information section 220 of a typical data packet (FIG. 2, 200), having an EHC field 224, which may be used to communicate keyboard data. In one example the information section 220 is typically eight nibbles in length 402, each nibble comprising 4-bits. The first 3-bits of nibble 0 typically provide a device address field 222, as described above. The next 5-bits typically provide an EHC field 224, as described above. The remaining 24-bits typically provide space 226 for up to 24-bits of data from the source keyboard and form a keyboard data package 430. In one example the keyboard data package 430 may take the form shown in block 440 comprising an 8-bit key code in the key 2 field 441 followed by an 8-bit key code in the key 1 field 442 followed by an 8-bit key code in the modifier key field 443.

In one example the key 1 field 442 typically provides the key code for the first non-modifier key being depressed. The key 2 field 441 typically provides the key code for the second non-modifier key being depressed. Key codes are typically transmitted on a depression of a key. On a key release, the code 0x00 is typically transmitted. The key 2 field 441 is typically used only if the key 1 field 442 is used to represent the first non-modifier key currently depressed/closed. If key 1 is released while key 2 remains depressed, the key 2 code is typically moved to the key 1 position and the key 2 code is replaced with the code 0x00. The typical bit definitions for the keys represented in the modifier field 443 are shown in Table 10. A binary 1 typically indicates that the modifier key is depressed/closed. A binary 0 typically indicates that the modifier key is released/open. When all keys are released, an "All Keys Up" keyboard packet is typically transmitted where the key 2, key 1 and modifier keys fields 441, 442 and 443 contain the codes 0x00. In other examples keyboard data may be provided in a different order or represent keyboard key presses/releases in a different manner.

TABLE 10

| Bit 7 | Bit 6 | Bit 5 | Bit 5 | Bit 3 | Bit 2 | Bit 1 | Bit 0 |
|---|---|---|---|---|---|---|---|
| Right GUI | Right ALT | Right Shift | Right Control | Left GUI | Left ALT | Left Shift | Left Control |

Figure 5:
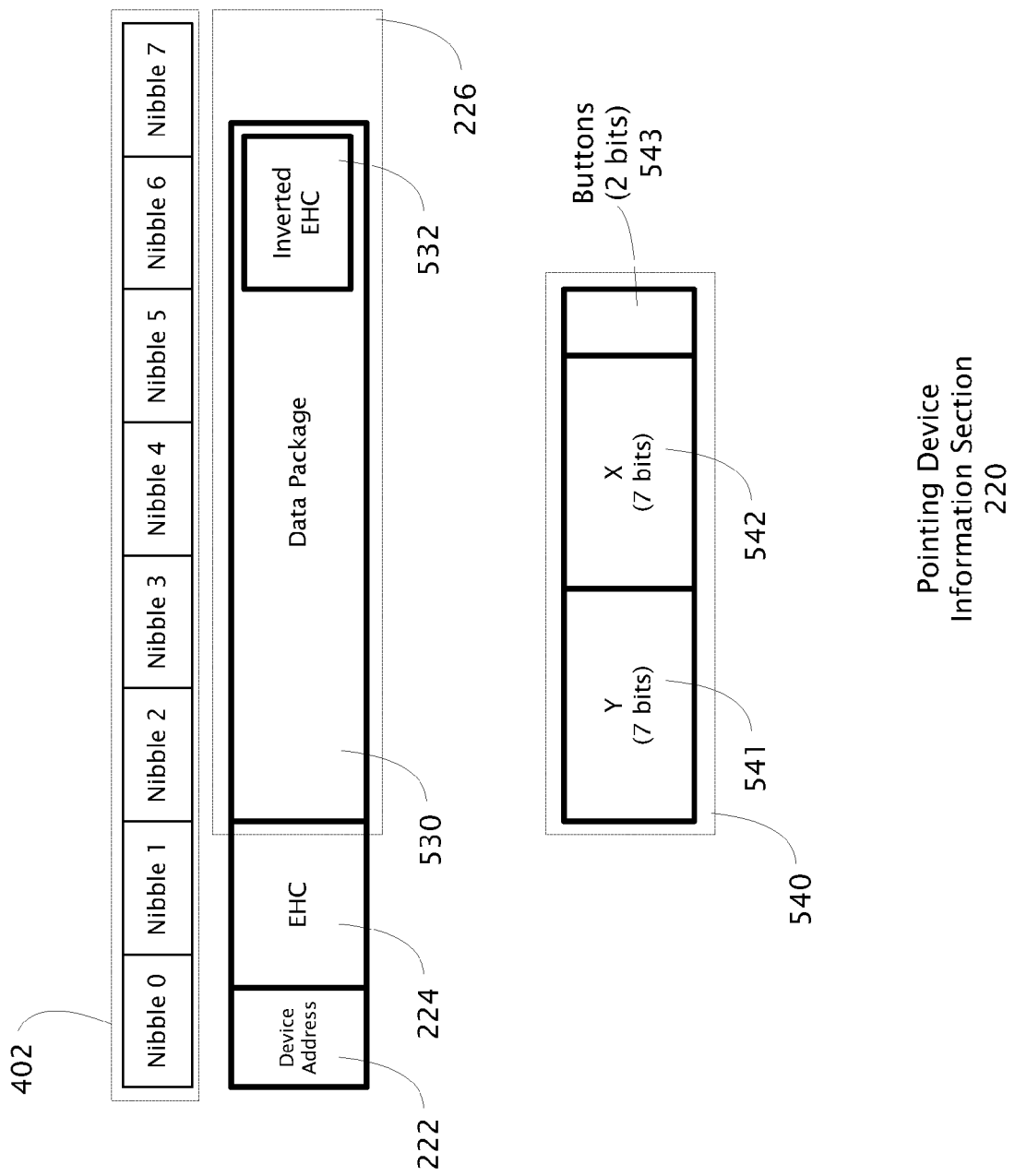
FIG. 5 is a block diagram showing the format of the information section of a data packet, having an EHC field, which may be used to communicate pointing device data.

FIG. 5 is a block diagram showing the format of the information section 220 of a data packet (FIG. 2, 200), having an EHC field 224, which may be used to communicate pointing device data. In one example the information section 220 is typically eight nibbles in length 402, each nibble comprising 4-bits. The first 3-bits of nibble 0 typically provide a device address field 222, as described above. The next 5 bits typically provide an EHC field 224, as described above. The remaining 24-bits typically provide space 226 for 16-bits of data from the source pointing device as well as 5-bits of additional inverted EHC information 532, which may be considered a part of the pointing device data package 530. In one example the pointing device data package 530 may take the form shown in block 540 comprising a 7-bit code in the Y field 541 followed by a 7-bit code in the X field 542 followed by a 2-bit button code in the buttons field 543.

In one example the X and Y field codes 542 and 542 are typically 7-bit signed values indicating relative x-coordinate and y-coordinate movement of a cursor. The two button code bits 543 typically represent right and left pointing device buttons, one bit per button. The inverted EHC 532 is typically the bit-inverted value of the EHC in field 224. In other examples pointing device data may be provided in a different order or represent pointing device movement and key presses/releases in a different manner. The inverted EHC 532 may also take alternate forms as described above.

Figure 6:
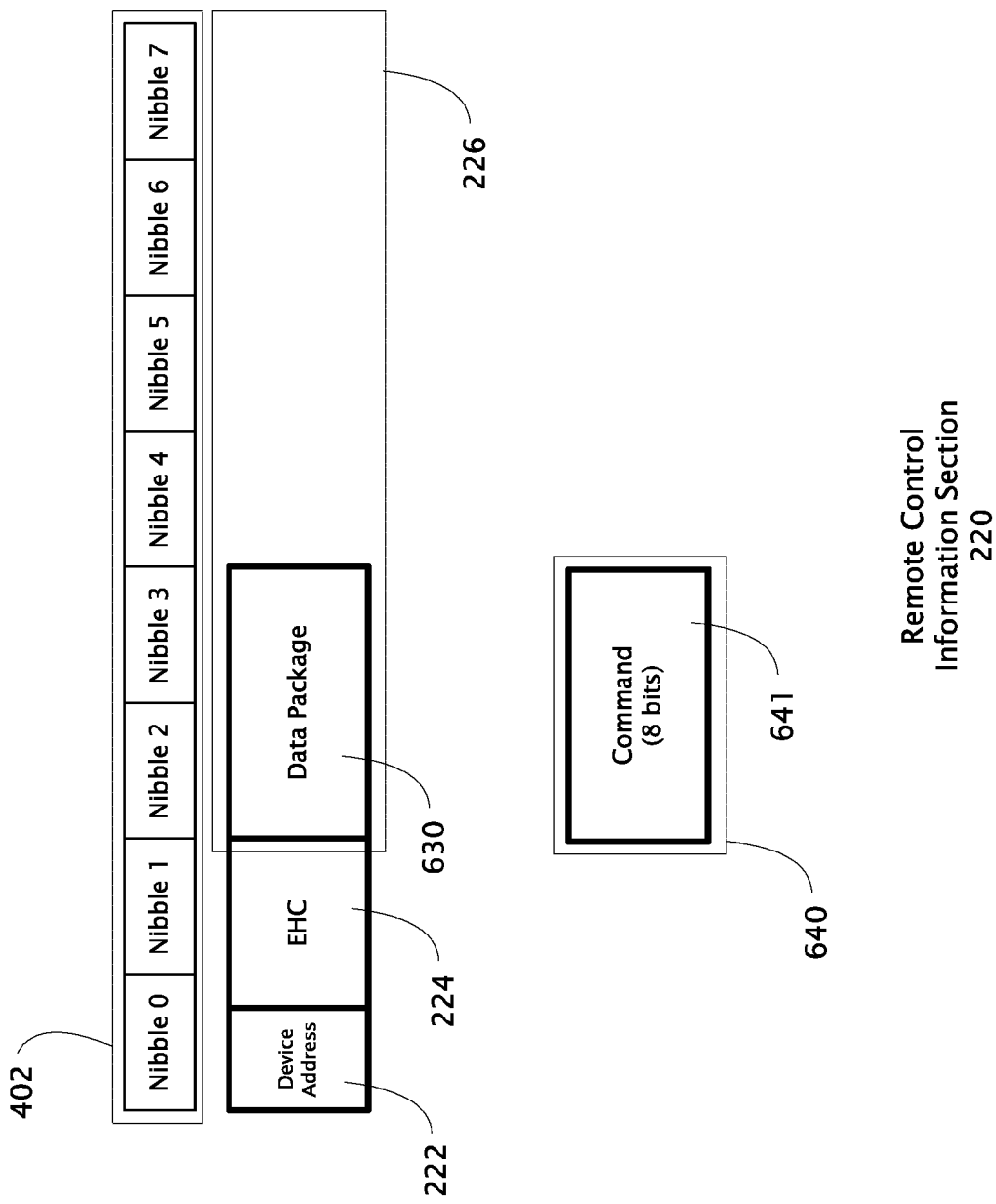
FIG. 6 is a block diagram showing the format of the information section of a data packet, having an EHC field, which may be used to communicate remote control data.

FIG. 6 is a block diagram showing the format of the information section 220 of a data packet (FIG. 2, 200), having an EHC field 224, which may be used to communicate remote control data. In one example the information section is typically eight nibbles in length 402, each nibble comprising 4-bits. The first 3-bits of nibble 0 typically provide a device address field 222, as described above. The next 5-bits typically provide an EHC filed 224, as described above. The remaining 24-bits typically provide space 226 for 8-bits of data from the source remote control device, forming a remote control data package 630. In one example the remote control data package 630 may take the form shown in block 640 comprising an 8-bit code in the command field 641.

In one example the command field 641 represents the remote control key being depressed. The remote control key code is typically transmitted on a depression. On its release, the code 0x00 is typically transmitted. In other examples remote control data may be provided using a different number of bits or represent key presses/releases in a different manner.

In order to allow for changes in packet format and structure, EHC calculation and other variations related to input device data as described above, it may be desirable to encode various parameters such that updated values can be used by software drivers rather than requiring the replacement of the drivers for updates. In one example this may be done by encoding various modifiable parameters in a computer's registry.

For flexibility in EHC calculation the relevant parameter values are typically stored in the registry and retrieved by a software driver, such as the device driver (FIG. 1, 140) coupled to various input devices, for performing EHC calculations on incoming data packets. In one example such a device driver would typically be capable of decoding data packets from each of the four input device types described above. Using information stored in the registry the driver would be capable of calculating EHC values for each of these packet types and support changes in these values without requiring an updated driver to be installed. The values listed in Table 11 may be stored in the registry and used by the driver in EHC calculations. In other examples other parameters may be stored in the registry and used in EHC calculations.

TABLE 11

| Value | Description |
| --- | --- |
| CheckSumResultsMasks | A binary value whose set bits indicate where in the DWORD the EHC(s) is(are) located |
| CheckSumResultsShiftBits | A binary value indicating the number of bits to shift the masked result bits right in order to form the final result. |
| CheckSumOperation | A DWORD value where 0 means no EHC and 1 means an EHC is used, and 2 means an EHC is used for the first result and an inverted EHC is used for the second result. Defaults to 0. |
| CheckSumWordsMasks | A binary value which can be interpreted as a series of DWORDS, each of which is a mask for the bits that are to be EHCed. The bits must be contiguous, and the number of set bits must be less than or equal to the check sum word size. |
| CheckSumWordsShiftBits | A binary value which can be interpreted as a series of BYTES, each of which is the number of bits to shift the masked bits right in order to form a word. These bytes map one-to-one with the CheckSumWordMasks DWORDS. |

Exemplary Computing Environment

Figure 7:
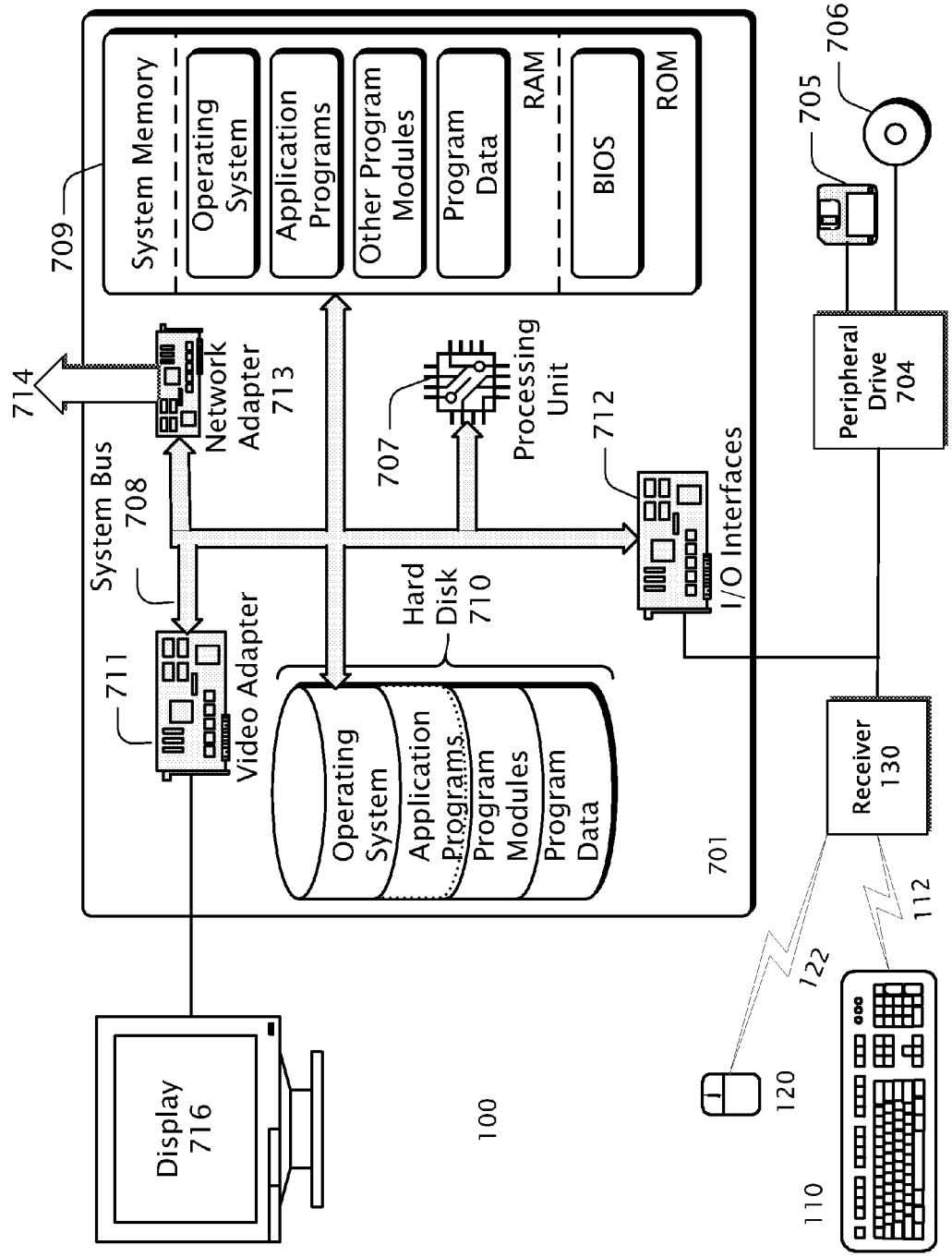
FIG. 7 is a block diagram showing an exemplary computing environment in which the processes, systems and methods described above for encoding and applying EHCs may be implemented.

FIG. 7 is a block diagram showing an exemplary computing environment 100 in which the processes, systems and methods described above for encoding and applying EHCs may be implemented. Exemplary personal computer 100 is only one example of a computing system or device that may provide secure computing environment and/or a protected environment and is not intended to limit the examples described in this application to this particular computing environment or device type.

A suitable computing environment can be implemented with numerous other general purpose or special purpose systems. Examples of well known systems may include, but are not limited to, personal computers ("PC") 100, hand-held or laptop devices, microprocessor-based systems, multiprocessor systems, set-top boxes, smart remote controls, programmable consumer electronics, gaming consoles, consumer electronic devices, cellular telephones, PDAs, and the like.

The PC 100 includes a general-purpose computing system in the form of a computing device 701 couple to various peripheral devices 704, 715, 716 and the like, including receiver 130 which may or may not be integrated with the rest of the computing system. System 100 may couple to various input devices, including a keyboard 110 and a pointing device 120 such as a mouse, through receiver 130 via some communications medium 112 and 122. The system 100 may be implemented on a conventional PC, a set-top box, a smart remote control, or the like. The components of computing device 701 may include one or more processors (including CPUs, GPUs, microprocessors and the like) 707, a system memory 709, and a system bus 708 that couples the various system components. Processor 707 processes various computer executable instructions to control the operation of computing device 701 and to communicate with other electronic and/or computing devices (not shown) via various communications connections such as a network connection 714 an the like. The system bus 708 represents any number of several types of bus structures, including a memory bus or memory controller, a peripheral bus, an accelerated graphics port, and/or a processor or local bus using any of a variety of bus architectures.

The system memory 709 may include computer readable media in the form of volatile memory, such as random access memory (RAM), and/or non-volatile memory, such as read only memory (ROM). A basic input/output system (BIOS) may be stored in ROM. RAM typically contains data and/or program modules that are immediately accessible to and/or presently operated on by one or more of the processors 707.

Mass storage devices 704 and 710 may be coupled to the computing device 701 or incorporated into the computing device 701 by coupling to the system bus. Such mass storage devices 704 and 710 may include a magnetic disk drive which reads from and writes to a removable, non volatile magnetic disk (e.g., a "floppy disk") 705, and/or an optical disk drive that reads from and/or writes to a non-volatile optical disk such as a CD ROM, DVD ROM or the like 706. Computer readable media 705 and 706 typically embody computer readable instructions, data structures, program modules and the like supplied on floppy disks, CDs, DVDs, portable memory sticks and the like.

Any number of program programs or modules may be stored on the hard disk 710, other mass storage devices 704, and system memory 709 (typically limited by available space) including, by way of example, an operating system(s), one or more application programs, other program modules, and/or program data. Each of such operating system, application program, other program modules and program data (or some combination thereof) may include an example of the systems and methods described herein.

A display device 716 may be coupled to the system bus 708 via an interface, such as a video adapter 711. A user can interface with computing device 100 via any number of different input devices such as a keyboard 110, pointing device 120, joystick, game pad, serial port, and/or the like. These and other input devices may be coupled to the processors 707 via input/output interfaces 712 that may be coupled to the system bus 708, and may be coupled by other interface and bus structures, such as a parallel port(s), game port(s), and/or a universal serial bus (USB) and the like. In particular, input devices may be coupled to the system 100 via receiver 130.

Computing device 100 may operate in a networked environment using communications connections to one or more remote computers and/or devices through one or more local area networks (LANs), wide area networks (WANs), the Internet, radio links, optical links and the like. The computing device 100 may be coupled to a network via a network adapter 713 or alternatively via a modem, DSL, ISDN interface or the like.

Communications connection 714 is an example of communications media. Communications media typically embody computer readable instructions, data structures, program modules and/or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communications media include wired media such as a wired network or direct-wired connection, and wireless media such as acoustic, radio frequency, infrared, and other wireless media.

Those skilled in the art will realize that storage devices utilized to store computer-readable program instructions can be distributed across a network. For example a remote computer or device may store an example of the system described as software. A local or terminal computer or device may access the remote computer(s) or device(s) and download a part or all of the software to run a program(s). Alternatively the local computer may download pieces of the software as needed, or distributively process the software by executing some of the software instructions at the local terminal and some at remote computers and/or devices.

Those skilled in the art will also realize that by utilizing conventional techniques that all, or a portion, of the software instructions may be carried out by a dedicated electronic circuit such as a digital signal processor ("DSP"), programmable logic array ("PLA"), discrete circuits, or the like. The term electronic apparatus as used herein includes computing devices and consumer electronic devices comprising any software and/or firmware and the like, and/or electronic devices or circuits comprising no software and/or firmware and the like.

The term computer readable medium may include system memory, hard disks, mass storage devices and their associated media, communications media, and the like.

The invention claimed is:

1. A method for forming a data packet having an extended hamming checksum, the method comprising:
   inserting, by a computing device, a device address in the data packet;
   inserting, by the computing device, an extended hamming checksum in the data packet, where the extended hamming code is based on at least a portion of the data packet indicated by a checksum mask; and
   inserting, by the computing device, a data package in the data packet where the data package comprises either a keyboard data package or a pointing device data package or a remote control data package.

2. The method of claim 1, wherein the extended hamming checksum is comprised of five bits.

3. The method of claim 1, wherein the data packet includes a command code.

4. The method of claim 1, wherein the data packet includes an inverted extended hamming checksum.

5. The method of claim 1 further comprising sending the formed data packet to another computing device.

6. A system for communicating input device data, the system comprising a computing device comprising a receiver configured for receiving and a data packet having an extended hamming checksum, a device address, and a data package comprising either a keyboard data package or a pointing device data package or a remote control data package, where the extended hamming code is based on at least a portion of the data packet indicated by a checksum mask.

7. The system of claim 6, wherein the receiver utilizes infrared light for receiving the data packet.

8. The system of claim 6, wherein the extended hamming checksum is comprised of five bits.

9. The system of claim 6, wherein the data packet is provided by a remote control device.

10. The system of claim 9, wherein the data packet includes a command code.

11. The system of claim 6, wherein the data packet is provided by a pointing device.

12. The system of claim 11, wherein the data packet includes an inverted extended hamming checksum.

13. The system of claim 11, wherein the data packet includes an x-coordinate code and a y-coordinate code and a button code.

14. The system of claim 6, wherein the data packet is provided by a keyboard device.

15. The system of claim 14, wherein the data packet includes a first key code and a second key code and a modifier keys code.

16. At least one computer storage device storing computer-executable instructions that, when executed by a computing device, cause the computing device to perform a method for forming a data packet having an extended hamming checksum, the method comprising:

inserting, by a computing device, a device address in the data packet;

inserting, by the computing device, an extended hamming checksum in the data packet, where the extended hamming code is based on at least a portion of the data packet indicated by a checksum mask; and inserting, by the computing device, a data package in the data packet where the data package comprises either a keyboard data package or a pointing device data package or a remote control data package.

17. The at least one computer storage device of claim 16, wherein the extended hamming checksum is comprised of five bits.

18. The at least one computer storage device of claim 16, wherein the data packet includes a command code.

19. The at least one computer storage device of claim 16, wherein the data packet includes an inverted extended hamming checksum.

20. The at least one computer storage device of claim 16, the method further comprising sending the formed data packet to another computing device.

* * * * *